United States Patent
Kansal et al.

(10) Patent No.: US 11,101,830 B2
(45) Date of Patent: Aug. 24, 2021

(54) CALIBRATION SCHEME FOR SERIALIZATION IN TRANSMITTER

(71) Applicant: Synopsys, Inc., Mountain View, CA (US)

(72) Inventors: Shourya Kansal, Bengaluru (IN); Ravi Mehta, Bengaluru (IN); Biman Chattopadhyay, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 146 days.

(21) Appl. No.: 16/522,852

(22) Filed: Jul. 26, 2019

(65) Prior Publication Data
US 2020/0036402 A1 Jan. 30, 2020

(51) Int. Cl.
| | |
|---|---|
| *H04L 27/00* | (2006.01) |
| *H04B 1/04* | (2006.01) |
| *H03M 9/00* | (2006.01) |
| *H03L 7/081* | (2006.01) |
| *H03L 7/197* | (2006.01) |
| *H03L 7/099* | (2006.01) |

(52) U.S. Cl.
CPC .............. *H04B 1/04* (2013.01); *H03L 7/081* (2013.01); *H03L 7/099* (2013.01); *H03L 7/1974* (2013.01); *H03M 9/00* (2013.01)

(58) Field of Classification Search
CPC ..... H04L 1/0003; H04L 1/0071; H04L 7/033; H04L 7/0075; H03L 7/0891; H03L 7/0802; H04B 10/616
USPC .......................... 375/295, 376; 327/156, 157
See application file for complete search history.

(56) References Cited

U.S. PATENT DOCUMENTS

| | | | | |
|---|---|---|---|---|
| 7,456,696 B2* | 11/2008 | Shen | ...................... | H03K 5/135 307/3 |
| 2010/0166132 A1* | 7/2010 | Tang | ...................... | H04J 3/047 375/372 |
| 2013/0076450 A1* | 3/2013 | Rao | ...................... | H03L 7/0896 331/34 |
| 2014/0035639 A1* | 2/2014 | Kitagawa | .............. | H03L 7/0802 327/158 |
| 2017/0288686 A1* | 10/2017 | Gao | ...................... | H03L 7/091 |
| 2018/0123575 A1* | 5/2018 | Huang | ............... | H03K 5/15046 |

* cited by examiner

*Primary Examiner* — Khai Tran
(74) *Attorney, Agent, or Firm* — Sterne, Kessler, Goldstein & Fox P.L.L.C.

(57) ABSTRACT

A system for clock calibration is described herein which comprises a serializer configured to convert an input data stream in parallel format to provide an out data stream in a serial format; a clock source configured to generate one or more clock signals; a first frequency divider configured to provide at least one divided clock signal of the one or more clock signals; a delay line configured to delay at least one divided clock signal; and a clock calibrator configured to control delay of the at least one divided clock signal at the delay line to adjust the one or more divided clock signals at a fixed relationship with respect to the one or more clock signals based on voltage and temperature variation.

20 Claims, 9 Drawing Sheets

CALIBRATION SCHEME FOR SERIALIZATION IN TRANSMITTER

CROSS-REFERENCE TO RELATED APPLICATIONS

The present application claims the benefit of Indian Patent Appl. No. 201811028061, filed on Jul. 26, 2018, which is incorporated herein by reference in its entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Many paragraphs in this disclosure are common to multiple Synopsys patent specifications.

FIELD(S) OF TECHNOLOGY

This disclosure relates to the field of transmitters in communication systems, specifically to serializers of high speed transmitters in wireless or wireline communications.

BACKGROUND

Today's communication system requires high speed data transmission. One of the way to provide such high speed data transmission is using a Serializer-Deserializer (SERDES), where the serializer is used in a transmitter to serialize multiple parallel input streams into a single output stream, and the deserializer in a receiver transforms the received single stream from the transmitter into parallel output streams. As the data from multiple parallel input streams are multiplexed via multiplexers at various stages and to finally form a single output streams, the data at various multiplexers are sampled using a stable and low noise clock. In serialization, at the last stage of 2:1 multiplexing, the timing path is very small, which is almost 1UI (1/data rate) to 2 UI depending upon architecture of the serializer. The input data at the multiplexer are not synchronized with the clock at the multiplexer. Further, meeting the timing path considering delay due to divider delay, buffer delay, and serialization operation becomes very challenging.

SUMMARY

The claims signify a brief description of one or more of the innovations, embodiments, and/or examples found within this disclosure.

This disclosure describes a transmitter that converts input streams of parallel format into an output stream of serial format. The transmitter uses a clock generator to generate one or more reference clock signals to use as reference for sampling and multiplexing of data at various multiplexing stages, such as 8:2 multiplexing stage and 2:1 multiplexing stage. The transmitter comprises one or more frequency dividers to generate a clock source of frequency f/N hertz and referenced as a divided clock that is generated from another clock of frequency f hertz and referenced as a fastest clock, where N=2. The transmitter further comprises a delay line formed of a fixed delay line and a variable delay line. The fixed delay line may delay the divided clock by a fixed delay period, such as either 0 unit interval (UI) or 1 UI. The fixed delay may delay the divided clock using the divided clock signal that is delayed in phase by 180 degrees. The variable delay line may introduce delay period that is variable. The variable delay may introduce delay of about 1.5 UI. The transmitter also comprises clock calibrator to delay the divided clock compared to the fastest clock such that the rising edge of the divided clock appears advanced at a fixed relationship with respect to the rising edge of the fastest clock. In one example, the clock calibrator may delay the divided clock compared to the fastest clock such that the rising edge of the divided clock appears advanced by one buffer period over the rising edge of the fastest clock. Thus, the fixed relationship may be measured or represented as one or more buffer period.

This disclosure also describes method for determining delay period required for the divided clock compared to the fastest clock such that the rising edge of the divided clock appears advanced at a fixed relationship with respect to the rising edge of the fastest clock. As described above, the fixed relationship may be measured or represented as one or more buffer period. The method accordingly comprises steps of setting the fixed delay period to 0 UI and changing the variable delay period corresponding to a plural bits control to the variable delay line. The method further comprises sampling the fastest clock by the delayed divided clock to generate a first output data stream, and sampling the first output data stream at another clock reference whose frequency is half of the frequency of the delayed divided clock to generate a second output data stream. The second output data stream is analyzed in a chunk of, for example, one thousand bits. When the number of bits with value 1's exceeds the number of bits with value 0 in the chunk of one thousand bits, a thermometric code corresponding to the plural bits control signal is stored in a memory as code-1. The above method steps then repeated with reference to the fixed delay period of 1UI. A thermometric code corresponding to the plural bits control to the variable delay line is stored in the memory as code-2, when the number of bits with value 1's exceeds the number of bits with value 0 in the chunk of one thousand bits. Finally, out of code-1 and code-2 the code which is near to center of the delay line is selected to delay the divided clock over the fastest clock for the multiplexing stages of a serializer at the power-up stage. Subsequently, in the mission mode, the divided clock is continuously delayed or advanced such that the divided clock appears advanced over the fastest clock by the fixed relationship, which as described above may be represented as one or more buffer period.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Exemplary Transmitter

Figure 1:
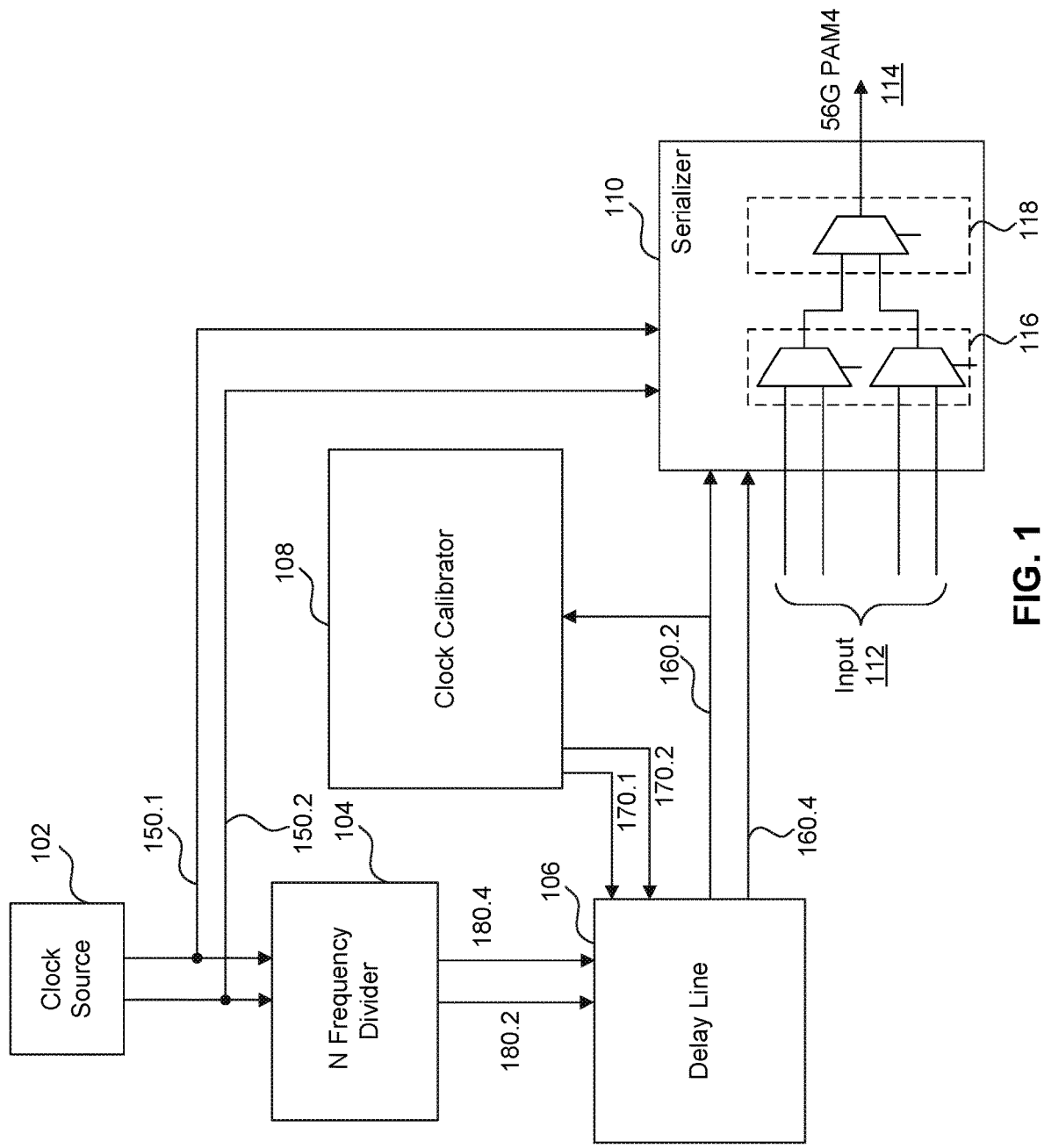
FIG. 1 is a block diagram of an exemplary transmitter according to an exemplary embodiment of the present disclosure.

FIG. 1 is a block diagram of an exemplary transmitter according to an exemplary embodiment of the present disclosure. As illustrated in FIG. 1, the transmitter 100 comprises a clock source 102, an N-frequency divider 104, a delay line 106, a clock calibrator 108, and a serializer 110. The transmitter 100 may be a transmitter transmitting data at any particular chosen or configured transmission speed depending on the requirement and purpose of the transmitter. The transmitter 100 may be a transmitter used to transmit data in a wireline or a wireless communication system. In this disclosure, exemplary embodiments are discussed with respect to a 56G PAM4 transmitter. However, the methods and systems disclosed here can be applied to any transmitter of any transmission speed.

As is generally known to a person skilled in the art, transmission of data requires modulation of a carrier signal using pulse modulation, frequency modulation, or phase modulation based on the data. However, this disclosure concentrates on carrier signal modulation using pulse modulation. In pulse modulation, there are two different coding schemes. The first coding scheme is known as Non-Return-To-Zero (NRZ). The NRZ coding scheme is also known as Pulse Amplitude Modulation 2-Level (PAM2), since the pulse in the PAM2 can have voltage level representing either value 1 or 0. The second coding scheme is known as Pulse-Amplitude-Modulation 4-Level (PAM4). In PAM4, the pulse has voltage level to represent four different levels and thus represents 2 bits logic as 00, 01, 10, and 11. Since PAM4 represents 2 bits worth of information in each symbol, PAM4 provides double throughput at the sample sampling frequency in comparison to PAM2.

The clock source 102 may provide of clock signal sources for sampling of data at a plurality of multiplexers and latches. The clock signal sources provided by the clock source 102 may be of different phases. For example, the clock source 102 may generate clock signal sources 150.1 and 150.2. The clock source 150.1 and the clock source 150.2 may each have a different phase. Though, only two clock signal sources are shown, the number of clock signal sources generated are not limited to two, and any number of clock signal source may be generated by the clock source 102. The clock source 102 may be a crystal or an oscillator. The clock source 102 may be based on a phase locked loop (PLL) or a non-PLL. However, in this disclosure, a clock based on PLL is recommended since the PLL based clock eliminates propagation delay and keeps the clock noise low. For the exemplary 56G PAM4 transmitter, the transmission speed is 28G symbol per second. Accordingly, the clock source 102 may use a reference input clock of 14 GHz. Similarly, for a 64G PAM4 transmitter, the clock source 102 may use a reference input clock of 16 GHz. The clock signal sources 150.1 and/or 150.2 may be referred as the fastest clock in this disclosure.

The N-frequency divider 104 may generate one or more clocks of integer divided frequency of the one or more output clocks of the clock source 102. The N-frequency divider 104 may be a fixed frequency divider or may be a configurable frequency divider. The frequency divider 104 may be an analog frequency divider or a digital frequency divider. The choice of the analog frequency divider or the digital frequency divider may depend on the frequency of the one or more output clocks of the clock source 102. As shown in the FIG. 1, the N-frequency divider 104 may generate one or more clocks of integer divided frequency of the frequency of the reference input, which may be the clock signal source 150.1 or the clock signal source 150.2. The one or more output clock of the N-frequency divider 104 may be referred as a divided clock in this disclosure. In FIG. 1, the divided clocks 180.2 and 180.4 generated by the N-frequency divider 104 are shown.

The serializer 110 serializes input data streams in parallel format to an output data stream in serial format. To perform this conversion of data streams from parallel to serial format, the serializer 110 comprises multiplexers at various different multiplexing stages. For example, one of the multiplexing stage may be 8:2 multiplexing stage, which generate two output data streams multiplexing eight input data streams using two or more multiplexers. Because an output of the serializer 110 is a single data stream in serial format, the final stage of multiplexing may be for example a 2:1 multiplexing stage, which generates a single output data stream multiplexing two data streams as input at a multiplexer and generate a single output stream in serial format. The 8:2 multiplexing stage and 2:1 multiplexing stage are exemplary only. A person skilled in the art may recognize that any number of multiplexing stages may be implemented which may take different number of data streams than mentioned here and may generate output data stream(s). Accordingly, this disclosure is not limited a serializer comprising 8:2 multiplexing and 2:1 multiplexing stages only. Further, a different clock may be used at different multiplexing stages of the serializer 110 for multiplexing input data streams at the multiplexer. A fastest clock may be used as a reference at the final multiplexing stage, i.e., the 2:1 multiplexing stage, whereas a divided clock may be used as a reference at the non-final multiplexing stages, i.e., the 8:2 multiplexing stage. Accordingly, the divided clock will be delayed by the fastest clock due to delay introduced by the N-frequency divider 104, CMOS buffer, etc. Further, a person skilled in the art knows that this delay introduced by the N-frequency divider 104, CMOS buffer, etc. is not fixed but changes continuously due to variations in the voltage and temperature.

As the clock used for reference at the 8:2 multiplexing stage, i.e., the divided clock, is delayed over a clock used for reference at the 2:1 multiplexing stage, i.e., the fastest clock, if the divided clock may be delayed more, a rising edge of the divided clock would be aligned or slightly advanced over a rising edge of the fastest clock.

Accordingly, the divided clock may be delayed enough so that the rising edge of the divided clock would be advanced over rising edge of the fastest clock. The divided clock may be delayed using the delay line 106. There are many different kind of delay lines, for example, electromagnetic delay lines, analog delay lines, and digital delay lines. An exemplary delay line is discussed in detail with respect to FIG. 2. The delay line 106 delays the reference clock at its input. Accordingly, an output of the delay line is time delayed reference clock. The time period for which the delay line may delay the reference clock at its input may be fixed or variable. The delay line may comprise a fixed delay line to provide a fix delay period and a variable delay line to provide a variable delay period. The time delay introduced by the fixed delay line such as no time delay or a fixed time delay may be controlled via a control signal 170.1. Similarly, the time delay introduced by the variable delay line may also be controlled via a control signal 170.2. The control signals 170.1 and 170.2 to control the fixed delay line and the variable delay line may be generated by the clock calibrator 108. The control signal 170.1 to a fixed delay line may be a 1 bit control signal that may cause the fixed delay line to either delay the reference input clock or pass the reference input clock without delay. The control signal 170.2 may cause the variable delay line to introduce variable delay in accordance. The variable delay lime may be formed by cascading a plurality of delay units, and each delay unit is controlled by an eight-bit control signal. Thus, the control signal 170.2 may be a control signal that may be k×8 bits control, where k represents number of delay units in the variable delay line.

Because of voltage and temperature variations, the delay between the reference clocks at the 8:2 multiplexing stage and the 2:1 multiplexing stage, in other words the delay between the fastest clock and the divided clock, varies constantly. Accordingly, clock calibrator 108 may control delay period of the reference clocks 160.2 and 160.4 at the 8:2 multiplexing stage 116 of the serializer 110 over the reference clocks 150.1 and/or 150.2 at the 2:1 multiplexing stage 118 of the serializer 110 such that the rising edge of the divided delayed clock 160.2 and/or 160.4 is advanced over the rising edge of the fastest clock 150.1 and/or 150.2 by at least one buffer period. How the clock calibrator determines the amount of delay required is discussed in detail below. The clock calibrator samples the fastest clock using the divided and delayed clock as a reference. Since, an rising edge of a clock may be identified when the sampled data goes from level 0 stage to level 1 stage. Accordingly, if the clock as a data is sampled, a percentage of bits with value 1 to percentage of bits with value 0 may be used to identify a rising edge of the fastest clock. Accordingly, an amount of delay period to the divided and delayed clock may be adjusted so that the divided clock is advanced over the fastest clock by at least buffer period to provide sufficient timing path at the final multiplexing stage. As the clock calibrator 108 constantly generates control signals 170.1 and 170.2 to update the delay period introduced by the delay line 106, so that the clock reference 160.2 and/or 160.4, which is divided and delayed clock, is one buffer period advanced over the clock references 150.1 and 150.2. Thereby, problems related to timing path requirement at the 2:1 multiplexing stage are solved. The clock calibrator 108 is discussed in detail with respect to FIG. 3.

The serializer 110 may comprise a plurality of multiplexing stages to convert input data streams in parallel format to an output data stream in serial format. As described above, the serializer may comprise for example a 8:2 multiplexing stage (not shown) and a 2:1 multiplexing stage (not shown) to convert input data streams 112 in parallel format to an output data stream 114 in serial format. Though, only four input data streams 112 are shown, a person skilled in the art would understand the serializer 110 is not limited to only four input data streams 112. Thus, a serializer may be implanted using a plurality of multiplexors, buffers, laches, etc.

Exemplary Delay Line

Figure 2:
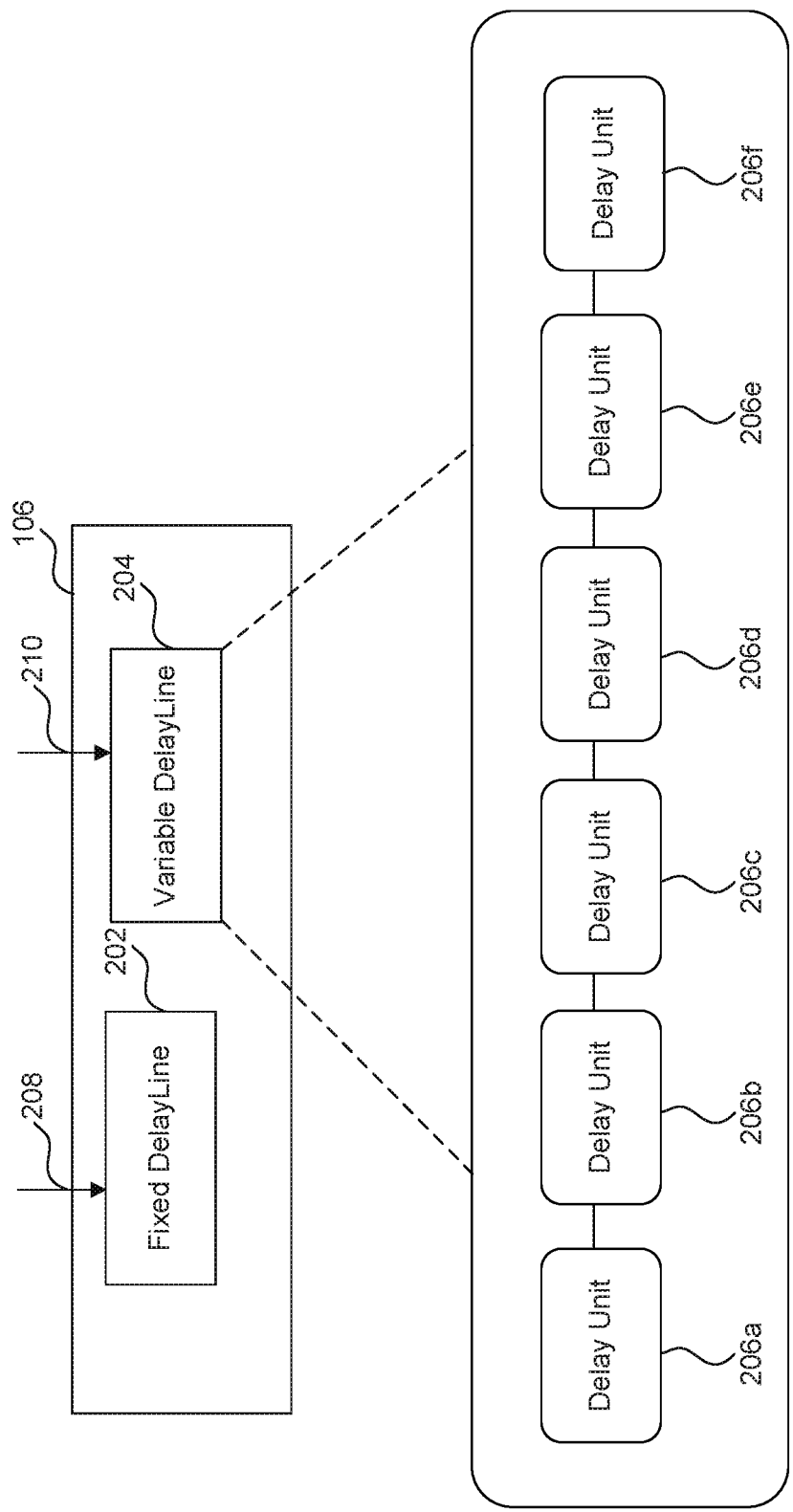
FIG. 2 is a block diagram of an exemplary delay line according to an exemplary embodiment of the present disclosure.

FIG. 2 is a block diagram of an exemplary delay line according to an exemplary embodiment of the present disclosure. The delay line 106 shown in FIG. 1 may comprise a fixed delay line 202 and a variable delay line 204 as shown in FIG. 2. The fixed delay line 202 and the variable delay line 204 may be configurable to introduce a delay of varying time period. The fixed delay line 202 may delay the clock by using a different phase of the clock at the input of the delay line 106. The variable delay line 204 may be a plurality of delay units 206a-206f coupled with each other to delay the clock as shown in FIG. 2. Each delay unit of the plurality of delay units 206a-206f may be an RC programmable delay unit. Further, the amount of delay period of the fixed delay line 202 and variable delay line 204 may be controlled by control signals control2 208 and control1 210 respectively. The control signals control2 208 and control1 210 are generated by the clock calibrator 108 as described in detail below. Any digitally controlled fixed delay line and variable delay line may be used to delay the clock.

As shown in the FIG. 2, the variable delay line comprises the plurality of delay units 206a-206f. Though, only six delay units are shown, a person skilled in the art would understand that addition of each delay unit allows furthering delaying the clock. Each delay unit may be a MUX based delay unit or a NAND based delay unit. Each delay unit may use thermometric code for the control-bits. Each delay unit may be controlled by eight-bit control. Since, the each delay unit is connected to each other to introduce variable delay of the desired period, in the exemplary configuration shown here, the thermometric code is 48-bits control.

As described above, meeting timing path at the last 2:1 multiplexing stage is difficult for a serializer of a high speed transmitter. Further, delay introduced by various components such as divider, CMOS buffer, multiplexer(s) etc. exceeds the available setup and hold time margin, which is about 1UI or 35.71 pico-seconds (ps). Further, voltage and temperature variations significantly affects the setup and hold time margin. Overall, the setup and hold time margin cannot be controlled. However, the reference clock signal used for sampling the data may be calibrated to launch the data such that it meets the setup and hold time margin.

Exemplary Clock Calibrator

Figure 3:
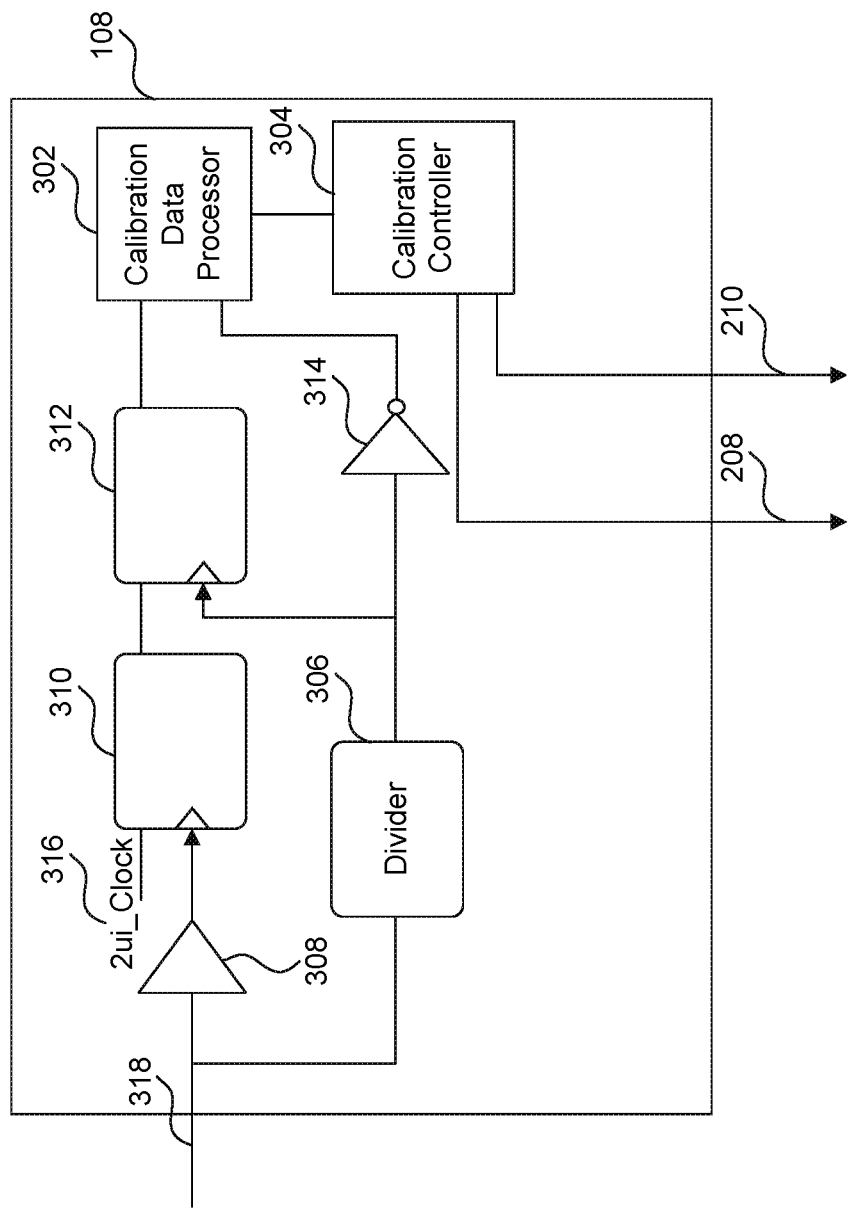
FIG. 3 is a block diagram of an exemplary clock calibrator according to an exemplary embodiment of the present disclosure.

FIG. 3 is a block diagram of an exemplary clock calibrator according to an exemplary embodiment of the present disclosure. As shown in FIG. 3, the clock calibrator 300 is an exemplary embodiment of the clock calibrator 108. The clock calibrator 300 comprises a calibration data processor 302 and a calibration controller 304. The calibration controller 304 is communicatively coupled with the calibration data processor 302 and the delay line 106. The calibration controller 304 sends control signals control2 208 and control1 210 to the delay line 106 to set the delay period for the fixed delay line and the delay period for the variable delay line. For example, a control signal control1 210 controls the variable delay line and a control signal control2 208 controls the fixed delay line. The control signals 208 and 210 transmits commands from the calibration controller 304 to control the fixed delay line and the variable delay line. In one example, the control signal control2 208 may be either an on/off signal to either delay the clock by a fixed period or no delay at all by the fixed delay line. The control signal control1 210 may control each delay unit of the plurality of delay units by an eight bit code so that each delay unit may delay the clock by a different delay period.

To determine the delay required for the divided clock to advance the divided clock at a fixed relationship with respect to the rising edge of the fastest clock, at the power up, the calibration controller 304 may set the control signal control2 208 to off, i.e., no fixed delay introduced by the fixed delay line. The variable delay line, for example, may comprise six RC programmable delay units 206a-206f. For an example, if control signal to each RC programmable delay unit is of 8-bits, then the control signal control1 210 could be a code of total 48 bits. In other words, the control signal control1 210 is divided into a plurality of groups of consecutive bits, for example, a plurality of groups of eight bits. The calibration controller 304 may sweep the control signal control1 210 to sweep thermometric code of N-bit control of the variable delay line, thereby generating a unique code with each sweep. For the exemplary variable delay line shown in FIG. 2 comprising six RC programmable delay units, N is 48. For each thermometric code, the fastest clock is sampled by using the divided delayed clock 318 as a reference, where the divided delayed clock 318 is delayed corresponding to the delay introduced by the delay line 106 corresponding to the control signals control1 and control2. The fastest clock may be sampled using a flip-flop 310 that has a delayed divided clock as reference. The output of the flip-flop 310 may be sampled again using a flip-flop 312 that has a clock reference, which may have a frequency that is half of delayed divided clock and may be generated using a frequency divider similar to 104 described above. The output of the flip-flop 312 may be monitored by the calibration processor 302. While the disclosure uses flip-flops for sampling of the clocks, the disclosure is not limited to use flip-flops only for sampling. Any other relevant digital circuit units that may be used for sampling of the data may be used instead of flip-flops.

The calibration processor 302 monitors, for example, 1000 bits of data, i.e. the fastest clock, and analyzes if there are more than 50% of 1's going from complete 0's stage. The calibration processor 302 stores the value of the control1 signal or thermometric code for which more than 50% of 1's going from complete 0's stage are observed as code1 in a memory (not shown) for example.

The calibration processor 302 then sets the calibration controller 304 to set control signal control2 208 to on, i.e., a fixed delay introduced by the fixed delay line. For example, the fixed delay introduced may be 1UI. The calibration controller 304 may sweep the control signal control1 210 to sweep thermometric code of N-bit control again, and for each code, the fastest clock is sampled by the divided clock, where the divided clock is delayed corresponding to the delay introduced by the delay line corresponding to the control1 and control2 signal. As described above, the fastest clock may be sampled using the flip-flop 310 that has the delayed divided clock as reference. The output of the flip-flop 310 may then sampled again using the flip-flop 312 that has the clock reference which as described above is half of delayed divided clock and generated using a frequency divider similar to 104 described above. The output of the flip-flop 312 as described above may be monitored by the calibration processor 302. Based on analysis of the 1000 bit of data the calibration processor 302 determines if there are more that 50% of 1's going from complete 0's stage. The calibration processor 302 stores the value of the control1 signal or thermometric code for which more than 50% of 1's going from complete 0's stage are observed as code2 for example. Subsequently, either of code1 or code2 whichever is nearer to the mid code is selected to configure or set variable delay period at the power-up stage. The mid code is center of the delay line.

After the initial delay period is determined and the divided clock is delayed such that the delayed divided clock appears advanced by a buffer period over the fastest clock, the delay period is continuously required to be adjusted to compensate for delay impacted by power, voltage, and temperature variation. Accordingly, in the mission mode, the calibration processor 302 continues the process as describe above to sample the fasted clock, and monitors, for example, 1000 bit of data, i.e., the fastest clock, and if detects more than 50% of 1's going from complete 0, then the calibration processor 302 may reduce the control signal control1 210 else increase the control signal control1 210. In other words, in the mission mode, the calibration controller 108 controls the delay of the variable delay line to remain at the same position of delay line where number of is in the sampled 1000 bit of data are more than number of 0s.

As described above, the clock calibrator 108 continuously determines the required delay of the divided clock such that the divided is exactly one buffer period advanced over the fastest clock even with all the delay present due to divider, jitter, etc. Thereby, making sampling of the data at the last multiplexing stage 2:1 of the serializer 110 shown in FIG. 1 to meet the timing path requirement even with the smallest timing path of 1UI.

Figure 4:
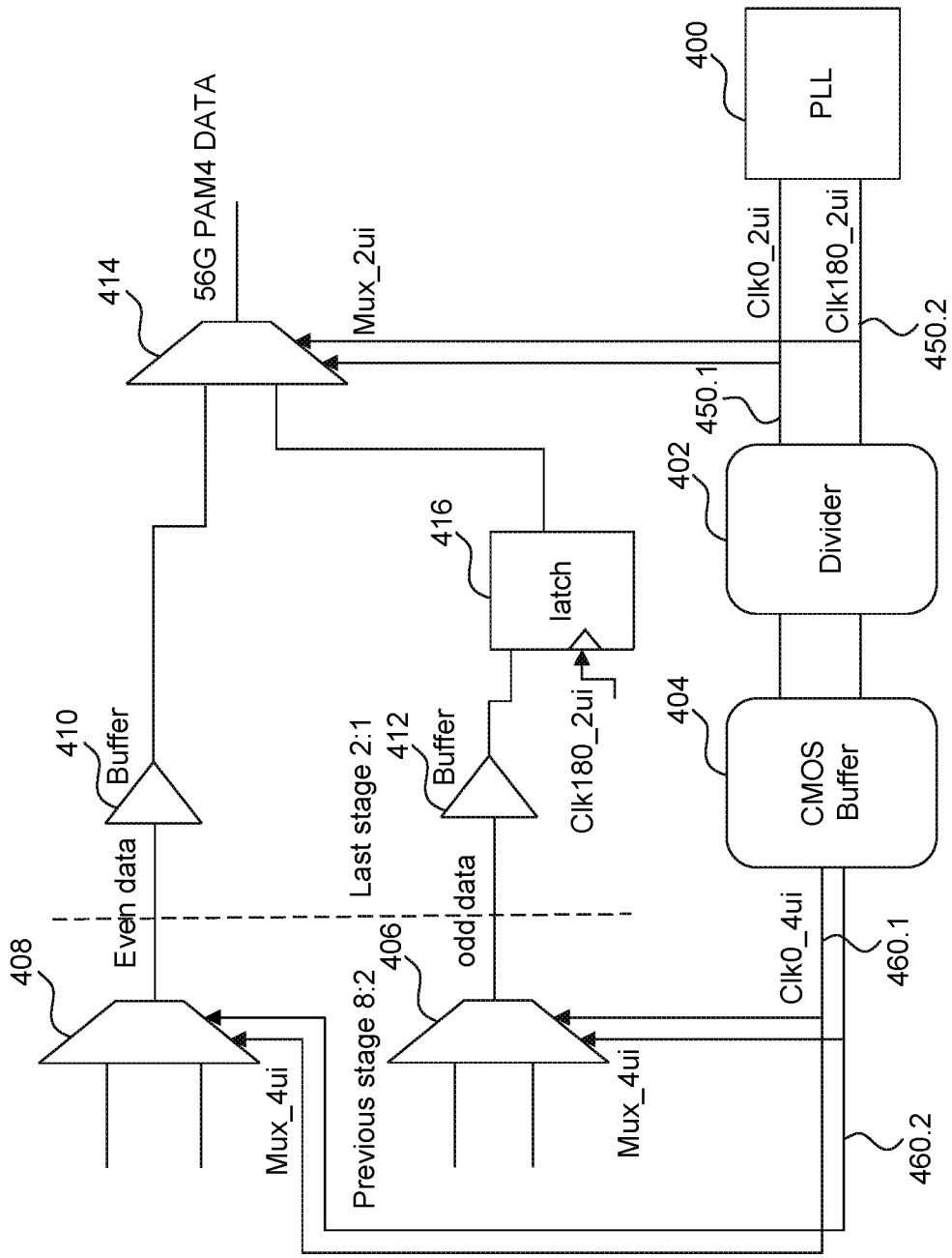
FIG. 4 is a block diagram of an exemplary transmitter, according to an exemplary embodiment of the present disclosure.

FIG. 4 is a block diagram of an exemplary transmitter, according to an exemplary embodiment of the present disclosure. In one example of the transmitter, with reference to FIG. 4, clocks clk0_2ui 450.1 and clk180_2ui 450.2 are used at the last 2:1 multiplexing stage, and clocks clk0_4ui 460.1 and 460.2 are used at previous multiplexing stage, for example 8:2 multiplexing stage, of the last 2:1 multiplexing stage in the transmitter 400. The transmitter 400 is similar to the transmitter 100 shown in FIG. 1. The clocks 460.1 and 460.2 may each be of a difference phase. The transmitter 400 may comprise a clock source 402 and an N-frequency divider 404. The clock source 402 may be a clock source similar to the clock source 102. The N-frequency divider 404 may be a frequency divider similar to the N-frequency divider 104. The transmitter 400 may further comprise multiplexors 408 and 410 at 8:2 multiplexing stage and a multiplexor 416 at the last 2:1 multiplexing stage. The multiplexor 416 at the last 2:1 multiplexing stage may use clk0_2ui 450.1 and clk180_2ui 450.2 to sample even data stream 418 and odd data stream 420 respectively. The multiplexors 408 and 410 at the 8:2 multiplexing stage may use clocks 460.1 and 460.2 to sample a plurality of parallel data input streams to generate the even data stream 418 and the odd data stream 420. The clocks 460.1 and 460.2 are of half frequency than the clk0_2ui 450.1 or clk180_2ui 450.2. Each clock 460.1 and 460.2 may be referenced as a divided clock in this disclosure, and the clk0_2ui and the clk180_2ui may be referenced as the fastest clock in this disclosure. Further, clk0_4ui 460.1 is advanced by an amount of a buffer delay over the clk0_2ui 450.1 and clk180_2ui 450.2 as described above using a delay line (not shown) under control of the clock calibrator (not shown).

Figure 5:
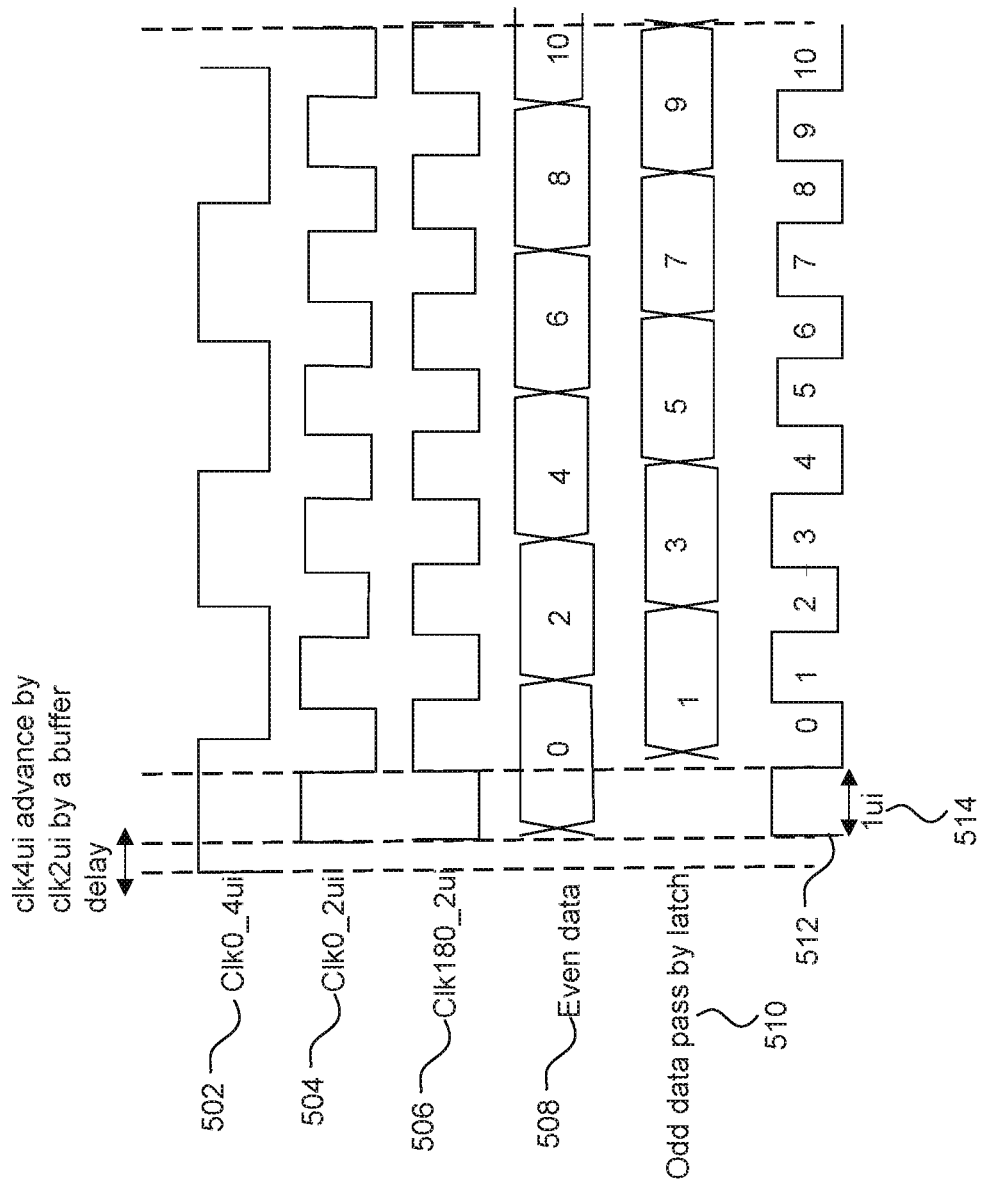
FIG. 5 is an exemplary timing diagram of the clock and data stream of the exemplary transmitter shown in FIGS. 1 and 4, according to an exemplary embodiment of the present disclosure.

FIG. 5 is an exemplary timing diagram of the clock and data stream of the exemplary transmitter shown in FIG. 4 and FIG. 1, according to an exemplary embodiment of the present disclosure As can be seen in the FIG. 5, the divided clock 502 is advanced by a buffer period over the fastest clocks 504 and 506 by sufficiently delaying the divided clock 502 by the delay line 106. Accordingly, when the even data stream 508 or 418, and odd data stream 510 or 420 when multiplexed at the last 2:1 multiplexing stage, the resultant output data stream 422 or 512 is as shown on the timing diagram in FIG. 5. Further, as described above, the divided clock 502 is advanced at a fixed relationship with respect to the rising edge of the fastest clocks 504 and 506.

The variable delay line of the delay line thus delays the one or more output clocks of the frequency divider 104, i.e., the divided clock, so that the divided clock may appear as if advanced over the input clock reference at the frequency divider 104, i.e., the fastest clock, and the timing path can be met all the time. The fastest clock is also used as reference clock for the last 2:1 multiplexing stage. The variable delay line 204 may therefore delay the one or more output clocks of the frequency divider 104 under control of the clock calibrator 108 at the power-up and during mission mode.

If a time taken from select line of the multiplexer of the 8:2 multiplexing stage to data available at the output of the multiplexer of the 8:2 multiplexing stage is represented by ts2q_mux_4ui, and the time that data should be available before the select line in-order to ensure 1% degradation in ts2q is represented as tsetup_mux_2ui, then setup margin may be calculated as (1UI−ts2q_mux_4ui−tsetup_mux_2ui). Similarly, if a time for which data should be available after the select line in order to ensure 1% degradation is ts2q as Thold_mux_2ui, then a hold margin may be calculated as (ts2q_mux_4ui−tsetup_mux_2ui). Since, (ts2q_mux_4ui tsetup_mux_2ui) is less than 1UI even in the worst case scenario for 16FFC process, if the divided clock is advanced by at least one buffer period, the timing path requirement can be met. Because the fastest clock, i.e., clk0_2ui, may be slightly advanced with respect to the divided clock, i.e., clk0_4ui, the divided clock may be delayed by about 2UI or 71.4 picoseconds to advance the divided clock by at least one buffer period. Additionally, the divided clock may be delayed by another 0.5UI to account for voltage and temperature variations. Overall, the delay line 106 may be required to delay the one or more output clocks of the frequency divider 104 by approximately 2.5UI under control of the clock calibrator 108.

Exemplary Algorithm for Clock Calibrator

Figure 6:
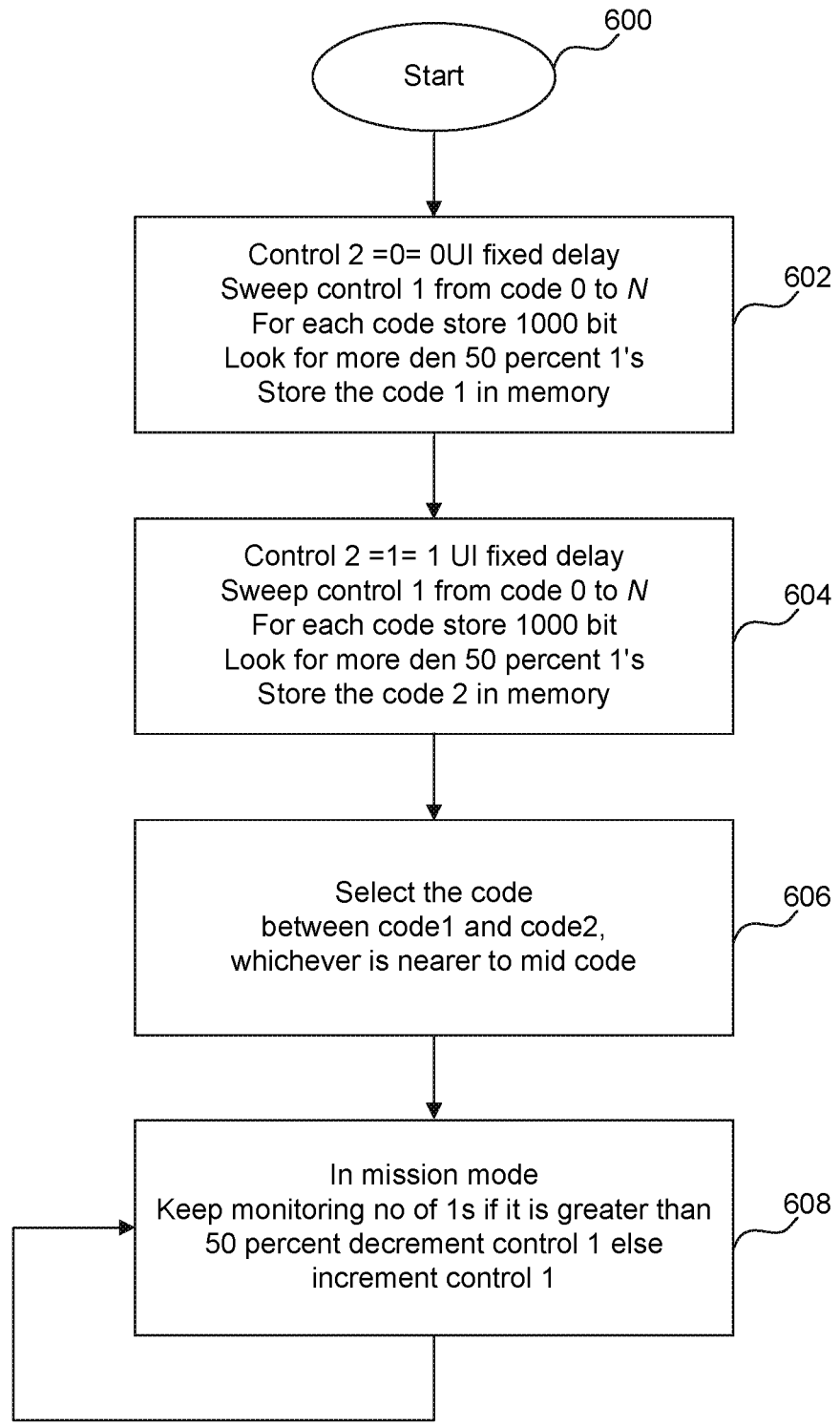
FIG. 6 is a flow chart of an exemplary algorithm according to an exemplary embodiment of the present disclosure.

FIG. 6 is a flow chart of an exemplary algorithm according to an exemplary embodiment of the present disclosure. An algorithm of generating control signals control1 210 and control2 208 starts at step 600 upon powering on the transmitter. Upon power on, at step 602, to determine how the rising edge of the divided clock and the fastest clock are positioned and to determine the delay required for the divided clock so that the divided clock appears a buffer period advanced over the fastest clock, the calibration controller sets the control signal to no delay by the fixed delay line. As described above, the calibration controller 304 generates control signal control2 208 of value 0 or binary OFF. Accordingly, the fixed delay line 202 may not introduce any delay to the divided clock. The calibration controller 304 then sweeps the control signal control1 210 to generate thermometric codes of a plural bits control. For each thermometric code generated by the plural bits control signal control1, the fastest clock is sampled by the divided clock, where the divided clock is delayed corresponding to the delay introduced by the delay line 106 corresponding to the control signals control2 208 and control1 210. For each thermometric code, 1000 bit of sampled data are stored and analyzed by the calibration processor 302. If the calibration processor 302 determines that analyzed data represents more than 50% of 1's going from the level of complete 0, the corresponding code value, i.e., the control signal value of control1 210 or the thermometric code may be stored as code-1 in the memory.

At step 604, the procedure described above for step 602 is repeated. However, the control signal control2 208 is set 1 or binary ON to introduce a fixed delay period of 1UI. The calibration controller 304 then sweeps the control signal control1 210. For each thermometric code generated by the plural bits control signal control1, the fastest clock is sampled by the divided clock, where the divided clock is delayed corresponding to the delay introduced by the delay line 106 corresponding to the control signals control2 208 and control1 210. For each code, 1000 bit of sampled data are stored and analyzed by the calibration processor 302. If the calibration processor 302 determines that analyzed data represents more than 50% of 1's going from the level of complete 0, the corresponding thermometric code value, i.e., the control signal value of control1 210 may be stored as code-2 in the memory.

At step 606, the calibration processor 302 determines initial delay required for the divided clock by selecting code-1 or code-2, whichever is closer to a mid-code.

After the power-up stage, the transmitter is in running mode or mission mode. As described above, a continuous adjustment of the delay period of the divided clock is required to offset any variations in the delay due to voltage and temperature variations. Accordingly, in the mission mode, at step 608, the fastest clock is continuously sampled as described above, and the sampled data are analyzed to determine if number of 1's going from complete 0's stage. If the calibration processor determines the number of 1's going from complete 0's are more than 50% then control signal control2 208 may be turned off so that there is no fixed delay introduced by the fixed delay line 202. Otherwise, control signal control2 208 may be turned on, while also updating the delay introduced by the variable delay line 204 using control signal control1 210. In the mission mode, step 608 may be executed continuously in a loop.

Technology Support

General Computer Explanation

Figure 7A:
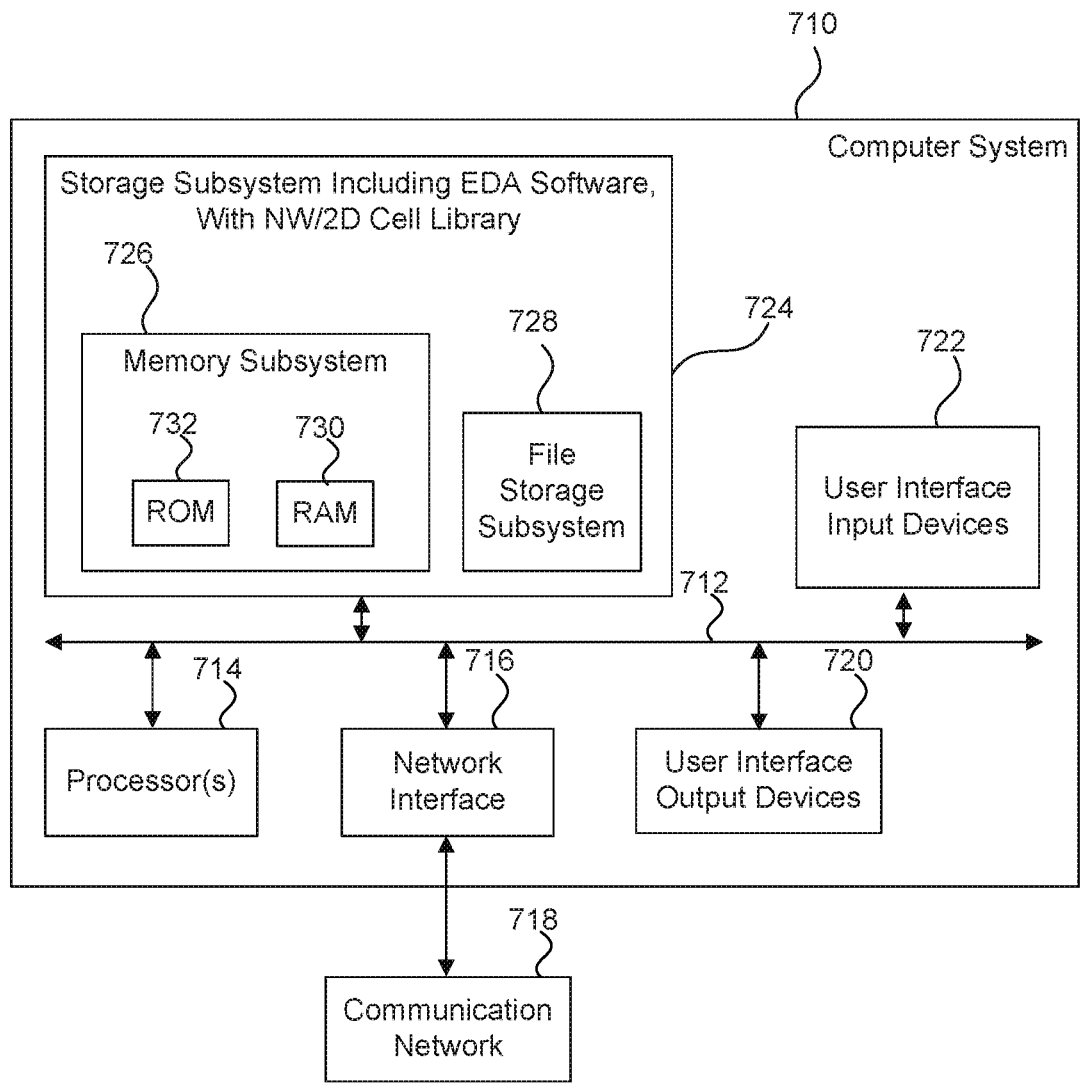
FIGS. 7A, 7B and 7C are simplified block diagrams of a computer system suitable for use with embodiments of the technology, as well as circuit design and circuit embodiments of the technology.
Figure 7B:
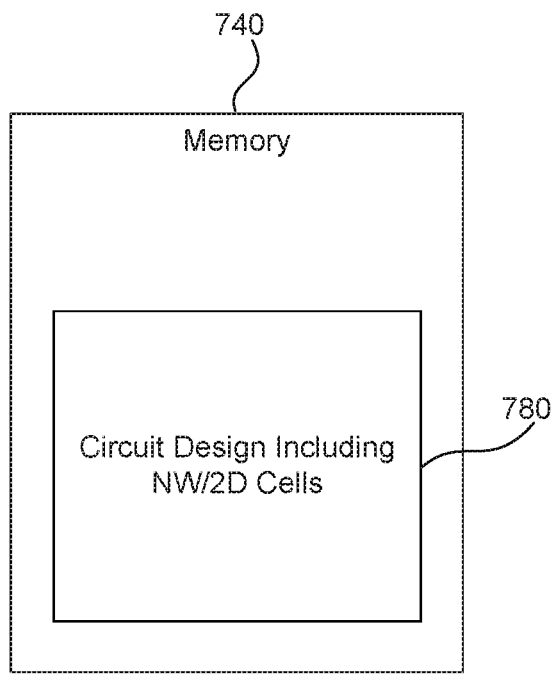
Figure 7C:
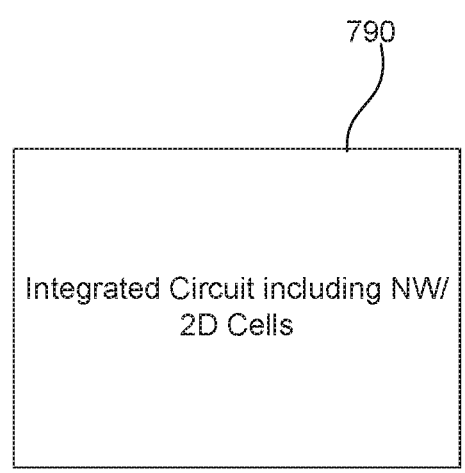

FIGS. 7A, 7B and 7C are simplified block diagrams of a computer system suitable for use with embodiments of the technology, as well as circuit design and circuit embodiments of the technology. As described above, the clock source 102, the N-frequency divider 104, the clock calibrator 108, the delay line 106, and/or the serializer 110 can be implemented in hardware, firmware, software, or any combination thereof. The discussion of FIGS. 7A, 7B and 7C to follow describes computer system 710 that can be used for these implementations.

In FIG. 7A, computer system 710 typically includes at least one computer or processor 714 which communicates with a number of peripheral devices via bus subsystem 712. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 724, comprising a memory subsystem 726 and a file storage subsystem 728, user interface input devices 722, user interface output devices 720, and a network interface subsystem 716. The input and output devices allow user interaction with computer system 710.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the present disclosure are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 710 depicted in FIG. 7A is intended only as one example for purposes of illustrating the preferred embodiments. Many other configurations of computer system 710 are possible having more or less components than the computer system depicted in FIG. 7A.

Network interface subsystem 716 provides an interface to outside networks, including an interface to communication network 718, and is coupled via communication network 718 to corresponding interface devices in other computer systems or machines. Communication network 718 may comprise many interconnected computer systems, machines and communication links. These communication links may be wireline links, optical links, wireless links, or any other devices for communication of information. Communication network 718 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 722 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 710 or onto communication network 718. User interface input devices typically allow a user to select objects, icons, text and the like that appear on some types of user interface output devices, for example, a display subsystem.

User interface output devices 720 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 710 to the user or to another machine or computer system.

Memory subsystem 726 typically includes a number of memories including a main random-access memory ('RAM') 730 (or other volatile storage device) for storage of instructions and data during program execution and a read only memory (ROM') 732 in which fixed instructions are stored. File storage subsystem 728 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 728.

Bus subsystem 712 provides a device for letting the various components and subsystems of computer system 710 communicate with each other as intended. Although bus subsystem 712 is shown schematically as a single bus, alternative embodiments of the bus subsystem may use multiple busses. For example, RAM-based main memory can communicate directly with file storage systems using Direct Memory Access (DMA') systems.

FIG. 7B depicts a memory 740 such as a non-transitory, computer readable data and information storage medium associated with file storage subsystem 728, and/or with network interface subsystem 716, and can include a data structure specifying a circuit design. The memory 740 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 7C signifies an integrated circuit 790 created with the described technology that includes one or more cells selected, for example, from a cell library.

Technology Support

Hardware/Software Equivalence

As described above, Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term 'processor' can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. No scientific evidence exists that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence of transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The 'substance' of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term 'software application' signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the C programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

Technology Support

EDA System/Workflow Explanation

Figure 8:
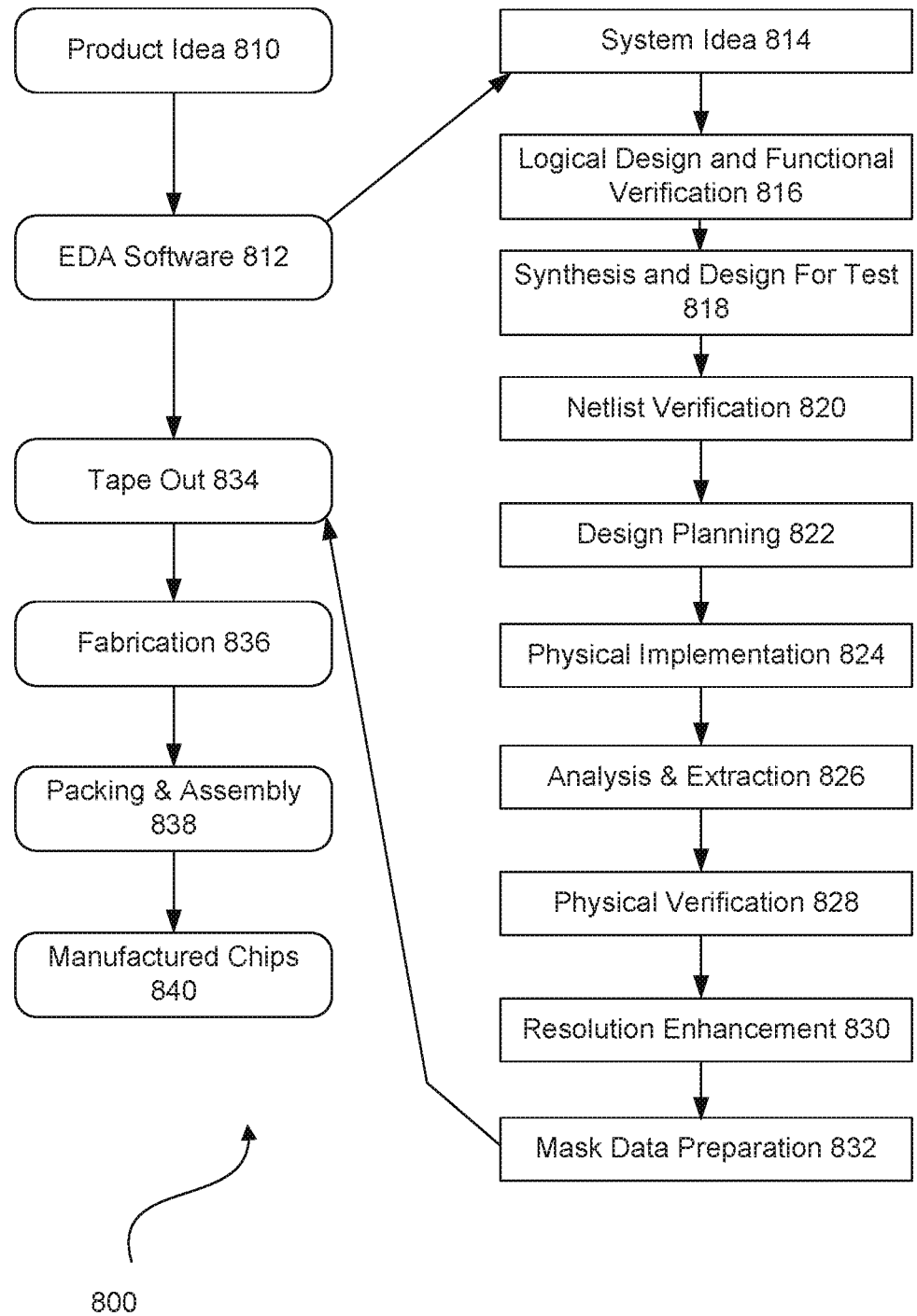
FIG. 8 is a block diagram of an emulation system.

FIG. 8 illustrates various processes 800 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation'. These processes start with the creation of a product idea 810 with information supplied by a designer, information which is transformed during a process to create an item of manufacture (referred to herein as a design or device) that uses an EDA software tool 812, which may also be signified herein as EDA software, as a design tool, or a verification tool. When the design is finalized, it can be taped-out 834, which typically is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed, which result in the finished integrated circuit 840 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language ('HDL') such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level ('RTL') description, a gate-level description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, which is much used for detailed descriptions of analog-based circuits.

A design process that uses an EDA software tool 812 includes processes 814 to 832, which are described below. This design flow description is for illustration purposes only and is not meant to limit the present disclosure. For example, an actual integrated circuit design may require a designer to perform the design operations in a different sequence than the sequence described herein.

During system design 814, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 816, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (RTM signifies 'Registered Trademark').

During synthesis and design for test 818, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 820, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 822, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 824, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 826, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 828, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 830, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 832, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above-mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 812.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

Conclusion

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed:

1. A system, comprising:
    a serializer configured to convert an input data stream in parallel format to provide an output data stream in a serial format;
    a clock source configured to generate one or more clock signals;
    a first frequency divider configured to provide at least one divided clock signal of the one or more clock signals;
    a delay line comprising a fixed delay line and a variable delay line, the delay line configured to delay the at least one divided clock signal; and
    a clock calibrator comprising a calibration controller configured to generate control signals corresponding to the fixed delay line and the variable delay line for controlling delay of the at least one divided clock signal at the delay line to adjust the at least one divided clock signal at a fixed relationship with respect to the one or more clock signals.

2. The system of claim 1, wherein the variable delay line comprises a plurality of RC programmable delay units.

3. The system of claim 1, wherein the clock calibrator further comprises:
    a calibration data processor configured to:
        send one or more commands to set a fixed delay period introduced by the fixed delay line;
        send one or more commands to set a variable delay period introduced by the variable delay line;
        analyze sampled data of the one or more clock signals using the at least one divided clock signal that is delayed by the delay line as a reference;
        determine an initial delay required for the at least one divided clock signal such that the at least one divided clock signal is adjusted at the fixed relationship with respect to the one or more clock signals.

4. The system of claim 3, wherein the control signals generated by the calibration controller comprise a first control signal of plural bits to the variable delay line and a second control signal of a single bit to the fixed delay line, wherein the first control signal of the plural bits is divided into a plurality of groups of consecutive bits, and each group of the plurality of groups causes each delay unit of the variable delay line to introduce different delay period.

5. The system of claim 4, wherein to determine the initial delay required for the at least one divided clock signal, the calibration data processor is further configured to:
    determine a percentage of bits of value 1 compared to a percentage of bits of value 0 when the fixed delay period being 0 unit interval (UI) and the variable delay period being changed by the variable delay line in response to the first control signal,
    based on the determination that the percentage of bits of value 1 are more than the percentage of bits of value 0, store a value of a code corresponding to the first control signal in a memory as a first code when the fixed delay period is 0 UI;
    determine the percentage of bits of value 1 compared to the percentage of bits of value 0 when the fixed delay period is 1 UI and the variable delay period is changed by the variable delay line in response to the first control signal,
    based on the determination that the percentage of bits of value 1 are more than the percentage of bits of value 0, store a value of a code corresponding to the first control signal in memory as a second code when the fixed delay period is 1 UI;
    determine a final code to set the variable delay period at power-up,
    wherein the final code is the first code when the first code is determined closer to a mid-code compared to the second code or the final code is the second code when the second code is determined close to the mid-code compared to the first code, and
    wherein the mid-code sets a delay period of the delay line being half of total delay period of the delay line.

6. The system of claim 3, wherein the calibration data processor is further configured to:
    send the one or more commands to reduce the variable delay period introduced by the variable delay line in response to determining that a percentage of bits with value 1 exceeds a percentage of bits with value 0 in a mission mode.

7. The system of claim 1, wherein the clock source is a phase-locked loop oscillator.

8. The system of claim 1, wherein each clock signal of the one or more clock signals has a difference phase angle.

9. The system of claim 1, wherein the at least one divided clock signal is of a frequency f/2 hertz and the one or more clock signals have a frequency f hertz.

10. The system of claim 4, wherein the calibration data processor is further configured to:
    send the one or more commands to increase the variable delay period introduced by the variable delay line in response to determining that a percentage of bits with value 0 exceeds a percentage of bits with value 1 in a mission mode.

11. A method for calibrating a reference clock, comprising:

generating a first clock of a first frequency using a frequency divider from a second clock of a second frequency;

delaying the first clock using a delay line compared to the second clock;

sampling the second clock by the delayed first clock to generate a first output data stream;

sampling the first output data stream by a third clock to generate a second output data stream, wherein the third clock is of half frequency compared to the first clock; and analyzing the second output data stream to determine a variable delay period required to align a rising edge of the first clock and a rising edge of the second clock such that the rising edge of the first clock is adjusted at a fixed relationship with respect to the rising edge of the second clock.

12. The method of claim 11, wherein the delay line comprises a fixed delay line and a variable delay line, wherein the variable delay line comprises a plurality of delay units connected to each other, and wherein each delay unit delays differently compared to other delay units of the plurality of delay units.

13. The method of claim 12, wherein the variable delay line comprises a plurality of RC programmable delay units.

14. The method of claim 12, further comprising:

sending one or more commands to set a fixed delay period introduced by the fixed delay line to delay the first clock;

sending one or more commands to set the variable delay period introduced by the variable delay line to delay the first clock; and in response to the one or more commands to set the fixed delay period and the one or more commands to set the variable delay period, generating control signals to control a delay period introduced by the delay line.

15. The method of claim 14, wherein the control signals comprise a first control signal of plural bits to the variable delay line and a second control signal of a single bit to the fixed delay line, wherein the first control signal of the plural bits is divided into a plurality of groups of consecutive bits, and each group of the plurality of groups causes each delay unit of the variable delay line to introduce a different delay period.

16. The method of claim 15, further comprising:

determining a percentage of bits of value 1 compared to a percentage of bits of value 0 in the second output data stream when the fixed delay period is 0 unit interval (UI) and the variable delay period being changed by the variable delay line in response to the first control signal, based on the determination that the percentage of bits of value 1 are more than the percentage of bits of value 0, storing a value of a code corresponding to the first control signal in a memory as a first code when the fixed delay period is 0 UI;

determining the percentage of bits of value 1 compared to the percentage of bits of value 0 in the second output data stream when the fixed delay period is 1 UI and the variable delay period is changed by the variable delay line in response to the first control signal, based on the determination that the percentage of bits of value 1 are more than the percentage of bits of value 0, storing a value of a code corresponding to the first control signal in memory as a second code when the fixed delay period is 1 UI; and determining a final code to set the variable delay period at power-up, wherein the final code is the first code when the first code is determined closer to a mid-code compared to the second code or the final code is the second code when the second code is determined close to the mid-code compared to the first code, and wherein the mid-code sets a delay period of the delay line being half of total delay period of the delay line.

17. The method of claim 14, further comprising:

sending the one or more commands to reduce the variable delay period introduced by the variable delay line in response to determining that a percentage of bits with value 1 exceeds a percentage of bits with value 0 in the second output data stream in a mission mode; and sending the one or more commands to increase the variable delay period introduced by the variable delay line in response to determining that the percentage of bits with value 0 exceeds the percentage of bits with value 1 in the second output data stream in the mission mode.

18. The method of claim 11, wherein the second clock is generated by a phase-locked loop oscillator.

19. The method of claim 11, wherein the first clock has a phase angle different from a phase angle of the second clock.

20. The method of claim 11, wherein the first clock is of a frequency f/2 hertz and the second clock is of a frequency f hertz.

* * * * *